Jan. 3, 1956 C. R. KENNY 2,729,745

SWEEP ARRANGEMENTS FOR SERVO SYSTEMS

Filed June 5, 1951

INVENTOR
CHARLES R. KENNY
BY Paul B. Hunter
ATTORNEY

United States Patent Office 2,729,745

Patented Jan. 3, 1956

2,729,745

SWEEP ARRANGEMENTS FOR SERVO SYSTEMS

Charles R. Kenny, Massapequa, N. Y., assignor to Sperry Rand Corporation, a corporation of Delaware Application June 5, 1951, Serial No. 230,060

1 Claim. (Cl. 250—36)

Figure 1:
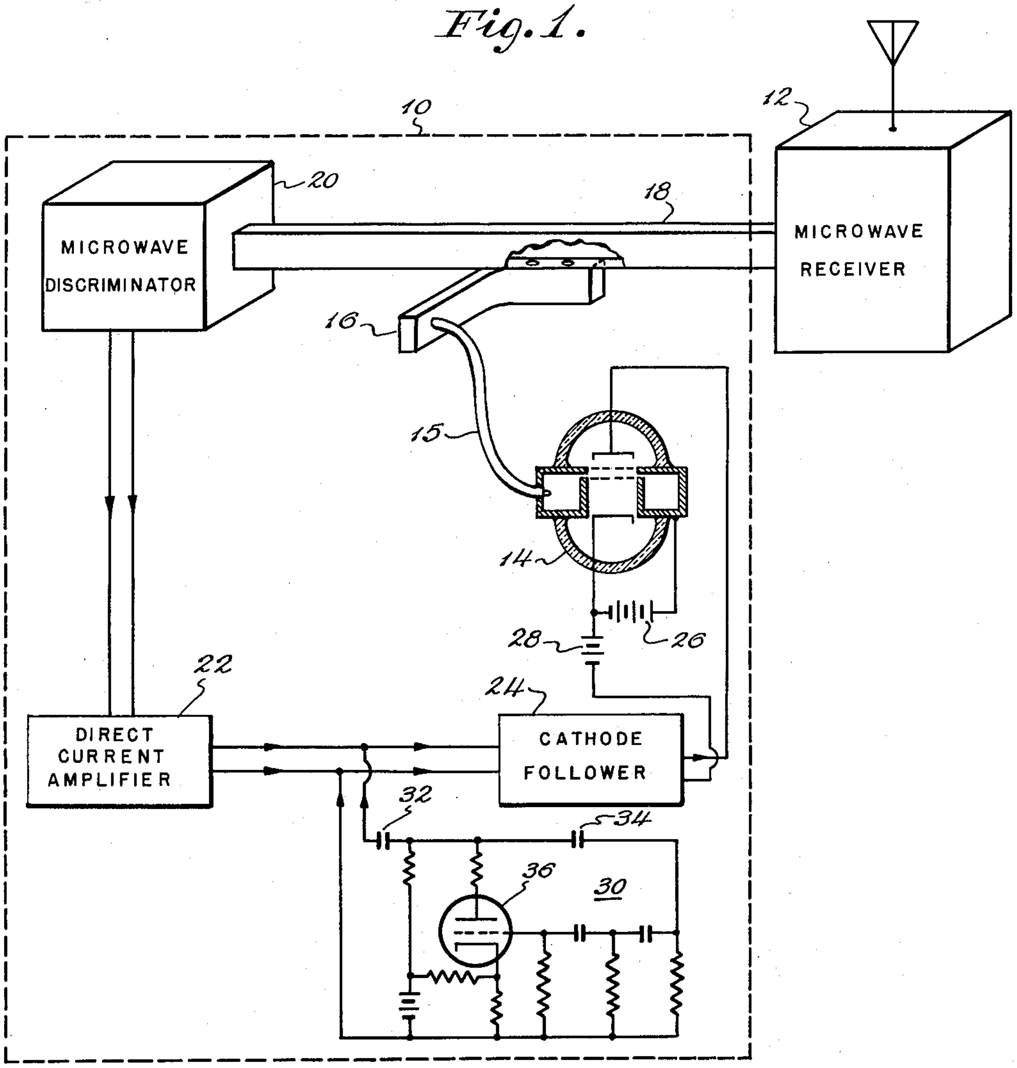

This invention relates to sweep arrangements for servo systems, and particularly to apparatus for sweeping servo systems which employ error detectors which function over a limited range.

One application of this invention is in automatic frequency control systems in which a servo system is employed to control the frequency of the local oscillator of a radio receiver.

In microwave receivers, it is known that one can compare the frequency of the signal produced by the local oscillator with the resonant frequency of a cavity resonator in a microwave discriminator and to produce a direct current error signal by means of the discriminator. The error signal is of one polarity when the frequency of the local oscillator is less than the resonant frequency of the cavity resonator, and it is of the opposite polarity when the frequency of the local oscillator is more than the resonant frequency of the cavity resonator. The error signal produced by the microwave discriminator is employed to control a servo system which in turn controls the frequency of the local oscillator.

Since the frequency range of microwave discriminators is rather limited, it is possible to provide automatic apparatus for causing the frequency of the local oscillator to sweep over a wide range until the frequency is within the frequency range of the discriminator. Once the frequency of the local oscillator is within the frequency range of the discriminator, the error signals produced by the discriminator serve to control the servo system and thereby maintain the frequency of the local oscillator at a predetermined frequency.

In conventional microwave receivers a reflex klystron tube is employed as the local oscillator, and the frequency of the signal produced by the klystron is initially caused to sweep over a wide range by means of a sawtooth wave generator which serves to vary the voltage applied to the repeller electrode of the klystron tube. When the frequency of the signal produced by the reflex klystron is within the frequency range of the discriminator, the sawtooth wave generator is stopped by means of automatic electronic control apparatus. Such apparatus for sweeping a servo system and then automatically stopping the sweep is rather complex and difficult to adjust.

The present invention provides a simplified arrangement for sweeping a servo system and automatically stopping the sweep as soon as the servo system locks. In accordance with the present invention, an automatic sweep arrangement is provided in a servo system by means of an oscillator having its output connected in shunt across the output of an amplifier in the servo system so that the effective impedance connected across the output of the oscillator varies in accordance with the variations in the effective output impedance of the amplifier. The effect of negative feedback around a servo loop is analogous to the effect of negative feedback in an amplifier, and the present invention is based upon the fact that the negative feedback which occurs around a servo loop reduces the effective output impedance of an amplifier in the servo loop in accordance with the amount of negative feedback. Thus, the effective impedance at the output of the amplifier, which is connected across the output of the oscillator, is high when the servo loop is in an unstabilized condition and is greatly reduced when the servo loop is in a stabilized or locked condition.

If the oscillator is a type which ceases to produce an output signal when its load impedance is small, the oscillator will produce the desired sweep signal when the servo system is in an unstabilized condition and it will cease to produce the sweep signal when the servo system is maintained in a stabilized or locked-in condition under the control of the error detector.

Thus, it is an object of this invention to provide an improved sweep arrangement for servo systems.

A further object of this invention is to provide an improved automatic frequency control system.

Figure 2:
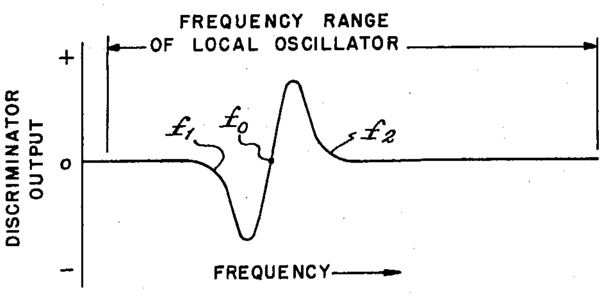

Other objects and advantages of the invention will be apparent from the following description, the appended claims, and the drawings, wherein Fig. 1 shows a preferred embodiment of the invention; and Fig. 2 shows a curve which represents the output signal produced by the discriminator employed in the apparatus shown in Fig. 1.

Referring now to the drawings, Fig. 1 shows the improved sweep arrangement employed in the automatic frequency control system of a microwave receiver.

The apparatus enclosed within the block 10 comprises the local oscillator for a microwave receiver 12. The ultra-high-frequency oscillations are produced by means of a reflex klystron tube 14 which is coupled to the microwave receiver 12 by means of a coaxial line 15, a directional coupler 16, and a waveguide 18.

The directional coupler 16 is connected so that the major portion of the energy generated by the klystron tube 14 is applied to the microwave receiver 12, and so that a small portion of this energy is propagated along the waveguide 18 to a microwave discriminator 20.

The microwave discriminator 20 may be a conventional type which compares the frequency of the signal applied thereto through the waveguide 18 with the resonant frequency of a cavity resonator contained within the microwave discriminator 20. Suitable microwave discriminators are disclosed on pages 63 to 68 in the book Technique of Microwave Measurements by C. G. Montgomery published by McGraw-Hill Book Company in 1947.

The microwave discriminator 20 serves as an error detector to produce a direct current error signal which is of negative polarity when the frequency of the signal applied thereto through the waveguide 18 is less than the frequency of the cavity resonator in the microwave discriminator 20, and it serves to produce an error signal of positive polarity when the frequency of the signal applied to the microwave discriminator 20 through the waveguide 18 is greater than the resonant frequency of the cavity resonator in the microwave discriminator 20.

The output of the microwave discriminator 20 is applied to a direct current amplifier 22 which has a large output impedance. The output of the direct current amplifier 22 is applied to a cathode follower 24 which serves to produce a variable direct current signal which is employed to control the magnitude of the negative voltage applied to the repeller electrode of the klystron tube 14.

The acceleration voltage for the reflex klystron 14 is provided by a source of potential 26. The voltage which is applied to the repeller electrode of the reflex klystron 14 is provided by means of a source of potential 28 and the variable direct current voltage which is provided at the output of the cathode follower 24, the output of the cathode follower 24 being connected in series between the source of potential 28 and the repeller electrode of the reflex klystron 14 so that the voltage which is applied between the cathode and the repeller electrodes of the reflex klystron 14 is equal to the voltage provided by the source of potential 28 less the voltage provided at the output of the cathode follower 24.

Thus, the microwave discriminator 20, the direct current amplifier 22, and the cathode follower 24 comprise a servo loop which may be employed to control the frequency of the oscillations produced by the reflex klystron 14 by controlling the magnitude of the potential which is applied to the repeller electrode of the reflex klystron 14.

Since the frequency range of the reflex klystron tube 14 is much larger than the frequency range of the microwave discriminator 20, it is necessary to provide apparatus for automatically causing the frequency of the signal produced by the reflex klystron 14 to vary or sweep over a wide range so as to cause the frequency of the signal produced by the reflex klystron 14 to fall within the frequency range of the microwave discriminator 20 and thereby permit the servo system to maintain the frequency of the signal produced by the reflex klystron 14 at a predetermined value.

Fig. 2 is a curve which represents the output of the microwave discriminator 20 as a function of the frequency of the signal which is applied thereto through the waveguide 18. The frequency range of the microwave discriminator 20 lies between the frequencies $f_1$ and $f_2$, and is much less than the frequency range of the reflex klystron 14. It is apparent that when the automatic frequency control apparatus is initially energized, it is unlikely that the frequency of the signal produced by the reflex klystron 14 will be within the frequency range of the microwave discriminator 20. Thus, auxiliary apparatus must be provided in order to cause the frequency of the signal produced by the reflex klystron 14 to sweep so that it will fall within the frequency range of the discriminator 20, and thereby permit the servo system to assume control and maintain the frequency of the signals produced by the reflex klystron 14 at the frequency $f_0$.

A suitable sweeping arrangement is provided by means of a phase shift oscillator 30 which is coupled in shunt across the output of the direct current amplifier 22 through a condenser 32. The output impedance of the direct current amplifier 22 is large when the servo system is in an unstabilized condition because there is substantially no feedback between the output and input circuits of the amplifier 22. Since the load impedance of the oscillator 30 is large for this condition, it serves to produce oscillations having a large amplitude. These oscillations serve to cause the cathode follower 24 to produce an output signal which varies over a sufficiently wide range to cause the frequency of the oscillations produced by the reflex klystron 14 to sweep through a large range of frequencies including frequencies within the frequency range of the microwave discriminator 20. As soon as the microwave discriminator 20 starts to produce an error signal, it serves to control the frequency of the oscillations produced by the reflex klystron 14 by means of the servo system, and the frequency of the oscillations produced by the reflex klystron 14 is maintained at the frequency $f_0$ shown in Fig. 2.

The error signal which is produced by the microwave discriminator 20, and which is applied to the input circuit of the direct current amplifier 22, is the equivalent of negative voltage feedback between the output and the input circuits of the direct current amplifier 22. This negative feedback serves to reduce the output impedance of the direct current amplifier 22 and, since the output circuit of the oscillator 30 is connected in shunt across the output circuit of the direct current amplifier 22, the negative feedback also serves to reduce the load impedance of the oscillator 30. Consequently, the amplitude of the signal produced by the oscillator 30 is greatly reduced and it has substantially no effect upon the servo system, so that the frequency of the oscillations produced by the reflex klystron 14 is controlled by the error signals produced by the microwave discriminator 20.

The positive feedback in the oscillator 30 which serves to cause the oscillator 30 to produce oscillations is provided by means of a condenser 34 which is connected between the output and control grid circuits of the oscillator tube 36. Thus, the positive feedback circuit of the oscillator 30 is coupled to the output circuit of the oscillator 30 and is responsive to the magnitude of the signal produced at the output circuit of the oscillator 30.

The reduction in the load impedance across the output circuit of the oscillator 30 when the servo system assumes control over the frequency of the signal produced by the klystron tube 14 serves to reduce the amount of positive feedback in the oscillator 30. Consequently, the amplitude of the oscillations produced by the oscillator 30 is greatly reduced as soon as the servo system assumes control, and when the load impedance across the output circuit of the oscillator 30 is reduced sufficiently to cause the positive feedback in the oscillator 30 to be insufficient to maintain the oscillator 30 in an oscillating condition, the oscillator 30 ceases to produce an output signal. Thus, the oscillator 30 has no effect upon the servo system as soon as the servo system is stabilized and the servo system then functions as if the oscillator 30 had been turned off.

If the servo system should lose control over the frequency of the reflex klystron tube 14, the feedback between the output and input circuits of the direct current amplifier 22 will decrease or disappear, and consequently the output impedance of the direct current amplifier 22 will increase. Under such conditions, the oscillator 30 will again produce an output signal which will cause the frequency of the reflex klystron tube 14 to vary over a wide range and thereby permit the servo system to assume control again.

The output impedance of the direct current amplifier 22 is determined by the following expression:

$$R_0=\frac{R_P}{1-\beta\mu}$$

where $R_0$ is the output impedance of the direct current amplifier 22, $R_P$=the plate resistance of the output tube (which equals the output impedance of the amplifier 22 in the absence of feedback), $\beta$ is the voltage feedback factor between the output and input circuits of the amplifier 22, and $\mu$ is the amplification factor of the direct current amplifier 22.

In one embodiment of this invention a reflex klystron tube 14 operating in the 9,000 megacycle region and an oscillator 30 which produced a signal having a frequency of 100 cycles per second were employed. The plate resistance of the output tube of the direct current amplifier 22 was 35,000 ohms, the amplification factor $\mu$ of the direct current amplifier 22 was 1,000, and the voltage feedback factor $\beta$ was unity when the servo system was in a stabilized condition so that the frequency of the signal produced by the reflex klystron 14 was maintained at the predetermined value $f_0$. Thus, in this embodiment of the invention, the load impedance for the oscillator 30 was approximately 35,000 ohms when the servo system was in an unstabilized condition, and this load impedance was reduced to 35 ohms when the servo system became stabilized at the desired frequency $f_0$ shown in Fig. 2.

If a small amount of positive feedback is provided between the output and the input terminals of the D. C. amplifier 22, the D. C. amplifier 22 will serve as both an amplifier and an oscillator, and then the oscillator 30 may be omitted. Such an arrangement is rather difficult to adjust; consequently, the arrangement shown in Fig. 1 is preferable.

If the oscillator 30 is replaced by a signal generator, such as an arrangement having an oscillator tube and a separate amplifier tube, which has a positive feedback circuit which is not responsive to the magnitude of the signal produced at the output of the signal generator, a sweeping action is obtained. The sweep signal produced by such an arrangement is greatly reduced in amplitude when the servo system is stabilized, but the sweep signal is never completely eliminated. The resulting frequency modulation of the signal produced by the reflx klystron 14 with such an arrangement imposes limitations on the usefulness of the system.

It will be apparent that the apparatus disclosed herein is not limited to automatic frequency control systems, but that it may be employed in various types of servo systems which employ error detectors which function over a limited range. Also, it will be apparent that various modifications may be made in the apparatus disclosed herein without departing from the scope of the invention. For example, the cathode follower 24 may be replaced by another type of direct current amplifier, and the phase shift oscillator 30 may be replaced by any suitable oscillator. Preferably, the oscillator should have a positive feedback circuit which is coupled to the output circuit of the oscillator so that the oscillator will cease to function when the impedance across its output circuit is reduced below a predetermined value.

Since many changes could be made in the above construction and many apparently widely different embodiments of this invention could be made without departing from the scope thereof, it is intended that all matter contained in the above description or shown in the accompany drawings shall be interpreted as illustrative and not in a limiting sense.

What is claimed is:

In an ultra-high frequency receiver, an automatic frequency control system for stabilizing the alternating output voltage from an ultra-high-frequency local oscillator at a fixed frequency independent of the frequency of a received signal, comprising in combination, an ultra-high-frequency discriminator coupled to the output of said local oscillator, said discriminator having a narrow band frequency response range which is within but less than the frequency range over which said local oscillator may be swept, said discriminator providing an output frequency control voltage when the frequency of said local oscillator is swept within the frequency response range of said discriminator, said frequency control voltage varying in magnitude and polarity according to departures of the frequency of said local oscillator from the lock-in frequency of said discriminator, a control amplifier coupled to the output of said discriminator for amplifying said frequency control voltage, means coupling the amplified frequency control voltage from the output circuit of said control amplifier to said local oscillator, an automatic sweep control means for sweeping the frequency of said local oscillator over a frequency band including the frequency response range of said discriminator, said sweep control means including an electron discharge tube and a feed-back circuit, said electron discharge tube having an input circuit and an output circuit, the output circuit of said electron discharge tube being coupled across the output circuit of said control amplifier, said feed-back circuit being coupled between the output circuit and the input circuit of said electron discharge tube, said electron discharge tube providing a voltage amplification according to the value of impedance in the intercoupled output circuits, the value of the impedance in the intercoupled output circuits being sufficiently high when the frequency of said local oscillator is outside the frequency response range of said discriminator for providing a voltage amplification in said electron discharge tube sufficient to produce a low frequency oscillatory sweep voltage in the output circuit of said electron discharge tube, the value of the impedance in the intercoupled output circuits being appreciably lower when the frequency of said local oscillator is within the frequency response range of said discriminator, the resulting voltage amplification in said electron discharge tube being insufficient to sustain said low frequency sweep voltage, said low frequency sweep voltage across the intercoupled output circuits sweeping the frequency of said local oscillator over a frequency band including the frequency response range of said discriminator, said sweep control means automatically ceasing to produce a sweep voltage when the frequency of said local oscillator is within the frequency response range of said discriminator and the voltage amplification of said electron discharge tube falls below the value necessary to sustain said low frequency sweep voltage, the frequency of the alternating output voltage from said local oscillator being controlled solely by the amplified frequency control voltage from said control amplifier and being stabilized at a fixed frequency equal to the lock-in frequency of said discriminator.

References Cited in the file of this patent

UNITED STATES PATENTS

| | | |
|---|---|---|
| Re. 22,620 | Felch, Jr. | Mar. 20, 1945 |
| 2,287,925 | White | Apr. 22, 1942 |
| 2,434,293 | Stearns | Jan. 13, 1948 |
| 2,452,575 | Kenny | Nov. 2, 1948 |
| 2,521,700 | Dodington et al. | Sept. 12, 1950 |
| 2,541,454 | White | Feb. 13, 1951 |
| 2,564,005 | Halpern et al. | Aug. 14, 1951 |
| 2,594,263 | Munster | Apr. 22, 1952 |
| 2,623,177 | Hugenholtz | Dec. 23, 1952 |
| 2,640,156 | Schultz | May 26, 1953 |
| 2,686,877 | Lawson | Aug. 17, 1954 |